(12) United States Patent
Althaus et al.

(10) Patent No.: US 6,647,038 B2
(45) Date of Patent: Nov. 11, 2003

(54) OPTOELECTRONIC LASER MODULE

(75) Inventors: Hans-Ludwig Althaus, Lappersdorf (DE); Helmut Albrecht, München (DE); Manfred Rothhardt, Kunitz (DE); Martin Becker, Jena (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/970,441

(22) Filed: Oct. 3, 2001

(65) Prior Publication Data

US 2002/0196824 A1 Dec. 26, 2002

Related U.S. Application Data

(63) Continuation of application No. PCT/DE01/02262, filed on May 15, 2001.

(51) Int. Cl.[7] ............................... H01S 3/04; H01S 3/08
(52) U.S. Cl. ........................ 372/36; 372/101; 372/102
(58) Field of Search ................................ 372/102, 101, 372/49, 30, 33, 36, 98; 385/88

(56) References Cited

U.S. PATENT DOCUMENTS

| | | | | |
|---|---|---|---|---|
| 3,897,135 | A | * | 7/1975 | Dyott ........................ 372/49 |
| 5,181,213 | A | * | 1/1993 | Shinokura et al. ............ 372/30 |
| 5,305,336 | A | | 4/1994 | Adar et al. |
| 5,717,711 | A | * | 2/1998 | Doussiere et al. .......... 372/102 |
| 5,724,377 | A | * | 3/1998 | Huang ........................ 372/98 |
| 5,832,011 | A | | 11/1998 | Kashyap |
| 5,914,972 | A | * | 6/1999 | Siala et al. .................... 372/33 |
| 5,995,692 | A | * | 11/1999 | Hamakawa et al. .......... 372/49 |
| 6,226,311 | B1 | * | 5/2001 | Meliga et al. .............. 372/102 |
| 6,273,620 | B1 | * | 8/2001 | Kato et al. .................... 385/88 |
| 6,278,721 | B1 | * | 8/2001 | Joyce ......................... 372/102 |
| 6,337,874 | B1 | * | 1/2002 | Yang ......................... 372/102 |

FOREIGN PATENT DOCUMENTS

| | | | |
|---|---|---|---|
| DE | 198 23 691 A1 | 12/1999 | |
| EP | 1 059 711 A2 | 12/2000 | |
| JP | 09 049 948 A | 2/1997 | |
| JP | 11-326709 A | * 11/1999 | ............. H01S/3/18 |
| WO | WO01/24324 A2 | 4/2001 | |

OTHER PUBLICATIONS

Reinhold Paul: "Optoelektronische Halbleiterbauelemente (optoelectronic semiconductor components)", vol. 2, 1992, pp. 203–204; (No month).
Kenneth O. Hill et al.: "Fiber Bragg Grating Technology Fundamentals and Overview", Journal of Lightwave Technology, vol. 15, No. 8, Aug. 1997, pp. 1263–1276.

* cited by examiner

*Primary Examiner*—Quyen Leung
(74) *Attorney, Agent, or Firm*—Laurence A. Greenberg; Werner H. Stemer; Ralph E. Locher

(57) ABSTRACT

An optoelectronic laser module, in particular for dense wavelength division multiplex systems, is described. The laser module has a laser diode with an active region, an optical resonator containing a highly silvered reflecting surface and a Bragg interference grating which provides frequency-selective feedback, and a housing which accommodates the laser diode and has a holder for coupling an optical conductor. The Bragg interference grating is configured as a fiber Bragg grating in an optical conductor and the optical conductor is connected to the housing via the holder. As a result, it is possible with the use of standard components to provide a laser having an external resonator whose emission wavelength can be set in a simple way by suitable selection of the fiber Bragg grating.

14 Claims, 4 Drawing Sheets

OPTOELECTRONIC LASER MODULE

CROSS-REFERENCE TO RELATED APPLICATION

This application is a continuation of copending International Application No. PCT/DE01/02262, filed May 15, 2001, which designated the United States.

BACKGROUND OF THE INVENTION

Field of the Invention

The invention relates to an optoelectronic laser module having a laser diode with an active region, an optical resonator with a highly silvered reflecting surface and a Bragg interference grating that provides frequency-selective feedback. In addition, a housing accommodates the laser diode and has a holder for coupling an optical conductor. Such a laser module is suitable, in particular, for use in dense wavelength division multiplex (DWDM) systems.

Laser diodes having what is termed distributed feedback are known which, because of frequency-selective feedback, unlike laser diodes with a Fabry-Perot resonator emit not in a multimode fashion but in a single-mode fashion. In particular, there are known in this regard distributed Bragg reflector (DBR) lasers in the case of which a Bragg reflector is disposed outside the normal lasing zone. This is a structure with a periodic disturbance, the Bragg interference grating, which reflects an electromagnetic wave in a frequency-selective fashion, compare the reference by Reinhold Paul, titled "optoelektronische Halbleiterbauelemente), [Optoelectronic semiconductor components], Stuttgart 1992, pages 203–204.

It is also known to inscribe what is termed a fiber Bragg grating into an optical fiber. In order to generate a grating structure in this case, a reflective index is increased in specific regions of the fiber core of an optical fiber, for example by punctiform illumination of the fiber or by using a phase mask that generates an interference fringe pattern in the optical fiber. Current methods for generating a fiber Bragg grating are described in a reference by K. O. Hill et al. titled "Fiber Bragg Grating Technology Fundamentals and Overview", Journal of Lightwave Technology, Vol. 15, No. 8, August 1997, pages 1263–1276.

SUMMARY OF THE INVENTION

It is accordingly an object of the invention to provide an optoelectronic laser module which overcomes the above-mentioned disadvantages of the prior art devices of this general type, in which the wavelength of a laser diode can be stabilized in a simple way by a bragg interference grating, and can be set in the process to a desired value.

With the foregoing and other objects in view there is provided, in accordance with the invention, an optoelectronic laser module. The laser module contains a laser diode having an active region and a highly silvered reflecting surface, and an optical conductor having a Bragg interference grating providing frequency-selective feedback. The highly silvered reflecting surface and the Bragg interference grating form an optical resonator, the Bragg interference grating functioning as a fiber Bragg grating in the optical conductor. A housing is provided for accommodating the laser diode, the housing has a holder coupling the optical conductor.

Accordingly, the invention is distinguished in that the Bragg interference grating in the optical conductor is configured as a fiber Bragg grating, and the optical conductor is connected to the housing containing the laser diode via a holder. Because of the construction of the interference grating in the optical conductor to be coupled to the laser diode, the invention provides a laser having an external resonator, an external cavity laser (ECL). In this case, a desired wavelength of the laser diode can be set precisely by suitable selection of the grating period of the fiber Bragg grating.

In particular, by changing the pluggable optical conductor it is possible to provide a fiber Bragg grating having a different desired grating period which leads to a changed emission wavelength of the laser diode. The invention therefore permits in a simple way a setting or a selection of the emission wavelength of a laser diode, without the need to change the actual configuration of the laser diode.

Moreover, the structure according to the invention has the advantage that a very stable single-mode operation of the semiconductor laser is ensured in the case of use of quartz glass as the optical conductor material. Thus, by comparison with a semiconductor material in which the Bragg grating is constructed in the case of a DBR laser, in quartz glass the change in wavelength per Kelvin is approximately ten times smaller. Again, a larger effective wavelength is present because of the use of an external resonator. The module is therefore rendered more insensitive to temperature changes and to changes in the optical properties of the laser diode.

In a preferred refinement of the invention, the module has a coupling optical system between the optical conductor and the laser diode. The coupling optical system preferably contains a high-index coupling lens with a focal length of preferably less than one millimeter. The coupling lens is, in particular, a spherical or aspherical silicon lens, GaP lens, SiC lens or a lens made from another suitable high-index optical material. Again, use can be made of a glass lens with a particularly short focal length, in particular a glass aspheric.

The laser diode advantageously has a rear facet that is coated with a highly reflecting layer and constitutes the highly silvered reflecting surface of the resonator. A front facet of the laser diode is, by contrast, preferably coated with an antireflection layer which has a residual reflection of less than 0.1%, such that parasitic resonances of the optical resonator are suppressed. Light is emitted to the fiber Bragg grating or received thereby via the front facet, and so reflection at this facet is not desired.

In a preferred refinement of the invention, it is provided that the front facet is aligned slightly inclined to the optical axis of the laser diode, in particular at an angle of approximately 1° to 5°. This reduces undesired feedback owing to back reflections at other structures than the fiber Bragg grating.

The optical conductor is preferably embedded in a cylindrical ferrule that can be plugged into the holder of the housing. In this case, the ferrule can be part of a fiber plug connector that can be pluggably connected to the housing.

Again, the optical conductor can be connected to a fiber plug connector in another way than via a ferrule. The ferrule or the fiber plug connector can preferably be detachably connected to the housing such that the emission wavelength of the module can be changed by simply changing the optical conductor and providing an optical conductor with a different grating period.

The housing preferably has a cylindrical holder for an optical conductor. The cylindrical holder serves to hold and couple a cylindrical ferrule that contains the optical conductor with fiber Bragg grating. Furthermore, the housing preferably has a coaxial geometry, and is preferably a TO housing. An external cavity laser with a stabilized wavelength is provided in a very cost-effective way by the use of a standard component such as a TO housing into which there is preferably plugged as a pigtail a standard fiber plug connector which only additionally has one fiber Bragg grating.

The optical conductor is preferably a single-mode glass fiber, the fiber Bragg grating being located in the glass fiber directly downstream of the end face or facet of the glass fiber. As a result, the light launched into the glass fiber immediately strikes the Bragg reflector and is consequently immediately fed back in a wavelength-selective fashion. It is possible in this case to use standard glass fibers and glass fiber plug connectors for connecting the glass fiber to the housing of the laser module, a fiber Bragg grating being inscribed into the standard glass fiber.

The end face of the glass fiber is preferably chamfered in order to avoid undesired feedback to other structures than the fiber Bragg grating.

The length of the optical resonator is preferably so short that the circulation frequency of the light is above a desired modulation frequency of the module. Otherwise, it would not be possible to transmit information on the optical information channel provided by the laser. In particular, the length of the optical resonator is preferably less than ten millimeters.

In a preferred refinement, the module according to the invention has a plurality of laser diodes, optical resonators and fiber Bragg gratings which are respectively constructed in an optical conductor, the spatial grating period of the individual fiber Bragg gratings differing for each optical conductor in such a way that light of a different wavelength is launched in each case. This provides a module with a multiplicity of optical channels such as is applied in DWDM systems, in particular. In this case, typically more than 40 channels with channel spacings of 100 GHz are implemented in a dense wavelength division multiplex.

Other features which are considered as characteristic for the invention are set forth in the appended claims.

Although the invention is illustrated and described herein as embodied in an optoelectronic laser module it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
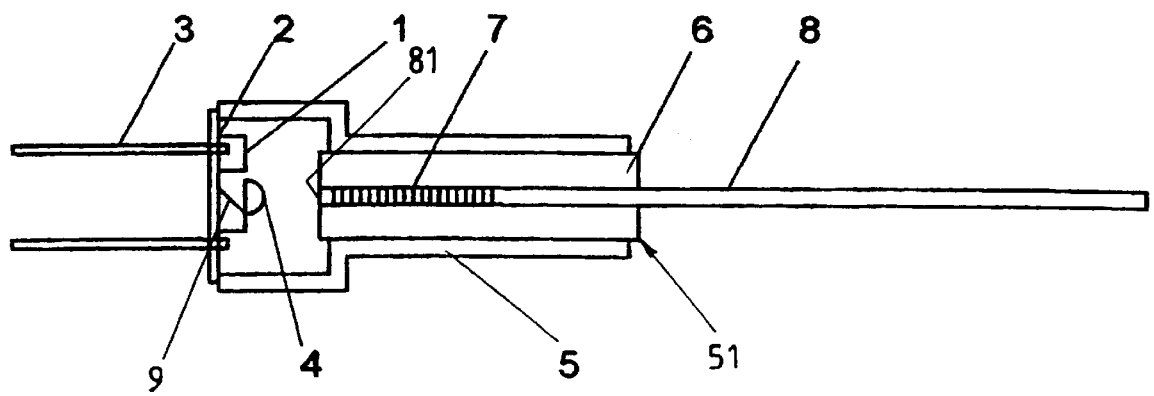
FIG. 1 is a diagrammatic, sectional view of a laser module according to the invention.

In all the figures of the drawing, sub-features and integral parts that correspond to one another bear the same reference symbol in each case. Referring now to the figures of the drawing in detail and first, particularly, to FIG. 1 thereof, there is shown a laser module according to the invention that has a laser chip 1 which is disposed on a TO base 2 of a TO housing 5. The TO housing 5 has a cylindrical coaxial geometry and forms a holder 51 into which it is possible to plug a glass fiber 8 surrounded by a ferrule 6 for the purpose of optical coupling.

The TO base 2 or the laser chip 1 disposed thereon is driven and supplied electrically via electric connections 3 which lead away from the TO base 2.

TO housings are standard housings, known in the prior art, for optical transmit or receive modules, the form of which resembles the housing of a standard transistor, but which have an opening on the topside for the entry or exit of light. A TO laser module, in the case of which a glass fiber is coupled to the TO laser module, is also designated as a coaxial module. The coupled glass fiber is also designated as a pigtail.

A facet or end face 81 of the glass fiber 8 is located in accordance with FIG. 1 in the interior of the housing 5, and is coupled optically to the laser chip 1 via a coupling optical system. The coupling optical system has a deflecting mirror 9 and a lens 4 located in a holder, which deflect light emitted by the laser chip 1 onto the end face of the glass fiber 8, or vice versa, and thereby couple the laser light from the laser diode 1 into the glass fiber 8.

Figure 4:
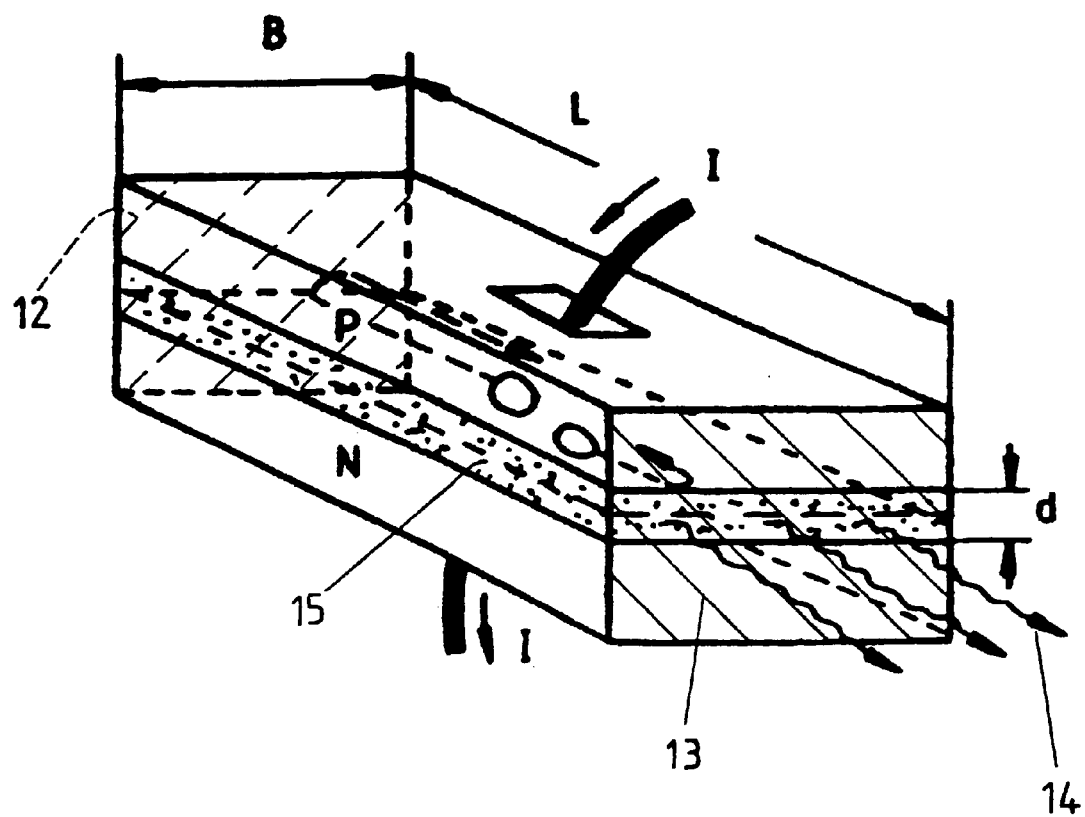
FIG. 4 is a perspective view of a laser diode of the laser module.

The laser chip 1 is a Fabry-Perot semiconductor laser chip and is illustrated schematically in FIG. 4. Accordingly, the chip 1 has in a way known per se a cuboid crystal volume with an active laser region 15 which is bounded by two plane-parallel crystal faces or facets 12, 13. The rear facet 12 of the laser chip 1 is provided with a highly reflecting layer, and constitutes a reflecting surface. The rear facet 12 can be assigned a monitor diode in this case (not illustrated).

By contrast, in a departure from conventional Fabry-Perot interferometers, the front facet 13 is antireflection-coated, and so laser light 14 passes the front facet 13 without reflections and is launched into the glass fiber 8 via the coupling optical system 9, 4 (compare FIG. 1). The residual reflections reach values below 0.1% in this case.

In an alternative refinement, the front and the rear facets of the laser chip 1 are slightly tilted with respect to the laser axis, in order to avoid undesired reflections and resonances.

According to FIG. 1, a fiber Bragg grating 7 is constructed in the region of the core of the glass fiber 8 (which is preferably a single-mode fiber) adjoining the end face 81. The fiber Bragg grating 7 is permanently inscribed into the fiber core of the single-made fiber 8, for example by lateral UV irradiation. A conventional single-mode glass fiber or a specifically doped UV-photosensitive fiber can be used in this case.

The grating period of the grating 7 is selected in such a way that only a desired wavelength $\lambda$ is retroreflected. The relationship holds in this case that the grating period is equal to $\lambda/2$ n, n being the refractive index of the glass fiber. A typical spatial grating period is approximately 0.5 $\mu$m.

The optical resonator of the laser is formed by the rear, silvered facet 12 of the laser chip 1 and the fiber grating 7 of the optical conductor 8. In this configuration, the fiber grating 7 provides frequency-selective feedback of the light emitted by the active region 15 of the laser chip 1, such that only the reflected frequency is amplified and emitted as laser light. A portion of the laser light is transmitted in this case into the optical fiber 8 through the fiber Bragg grating 7.

Figure 2:
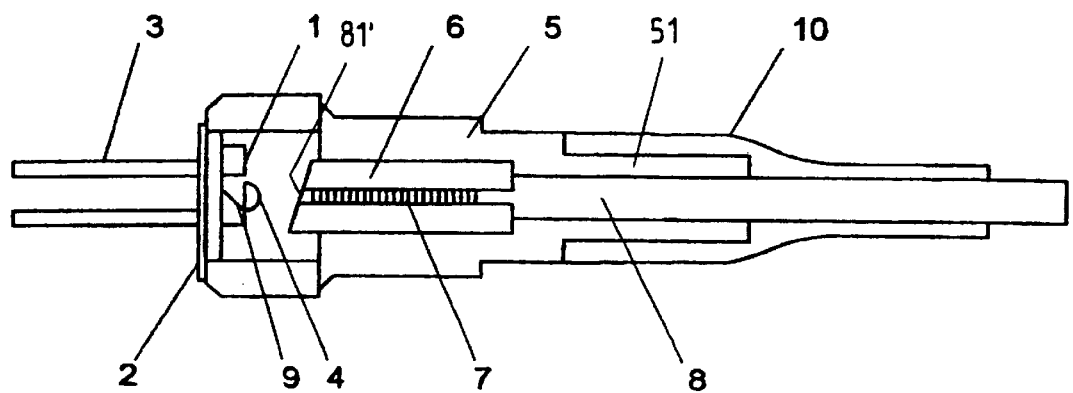
FIG. 2 is a sectional view of a second embodiment of the laser module.

A second exemplary embodiment of the invention is illustrated in FIG. 2. Identical elements are denoted in this case with identical reference numerals.

In the exemplary embodiment of FIG. 2, the ferrule 6, which surrounds the optical conductor 8, is permanently connected to the housing 5 of the optoelectronic module. A plastic sleeve 10 bearing against the holder 51 of the housing 5 ensures in this case that the optical conductor 8 cannot be bent too strongly.

The lens 4 is a silicon lens with a short focal length of preferably less than two, in particular less than one millimeter. The numerical aperture of the lens 4 is sufficiently large and is typically above the value of 0.4. The silicon lens was produced, for example, from a planar substrate via etched structures. Alternatively, it is also possible to use other spherical or aspherical lenses made from a suitable optical material for the respective wavelength region, for example made from glass, plastic, GaP or SiC. The refractive index of the lens is preferably greater than 2 in this case.

Only a specific, desired wavelength is reflected given appropriate selection of the grating period of the fiber Bragg grating 7, and so the laser starts up only for this wavelength. The remaining wavelengths are destroyed by interference.

An end face 81' of the glass fiber 8 is slightly chamfered in order to avoid undesired back reflections. The chamfering is typically 8°, it also being possible for larger or smaller angles, in particular between 5° and 25°, to be implemented, depending on the application.

Figure 3:
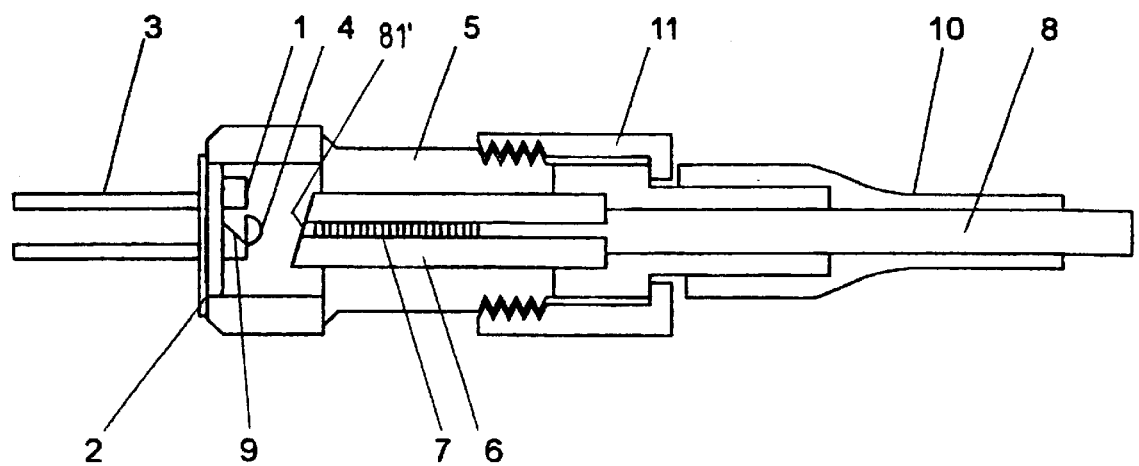
FIG. 3 is a sectional view of a third embodiment of the laser module.

FIG. 3 shows the module according to the invention, in the case of which the optical conductor 8 can be pluggably coupled to the housing 5 of the laser module. The holder of the housing 5 is constructed in this case cylindrically and in such a way that the ferrule 6 need only be pushed into the opening with the optical conductor 8. A screwable fixing element 11 serves a purpose of connecting the ferrule 6 and the glass fiber 8 permanently to the housing 5.

It is possible in this case for another fiber Bragg grating 7 to be provided in a simple way by exchanging the ferrule 6 with the glass fiber 8 and plugging in another glass fiber with a fiber grating of another grating period. Since a different grating period leads to a change in the frequency fed back, the emission wavelength of the laser module can be changed by changing the optical conductor 8 or the fiber grating 7. Experiments have shown that it is possible in this way to use only one laser to generate more than ten different channel wavelengths that, for example, respectively have a spacing of 100 MHz. This is particularly advantageous for providing replacement laser modules in systems with many WDM channels.

In the exemplary embodiments of FIGS. 2 and 3, the resonator length of the laser module is selected to be short in such a way that the circulation frequency of the light in the resonator is higher than the desired modulation frequency of the module. In this case, the resonant frequency is at bit rates of the modulated signal of up to 10 Gbit/s in conjunction with approximately 15 GHz.

Figure 5:
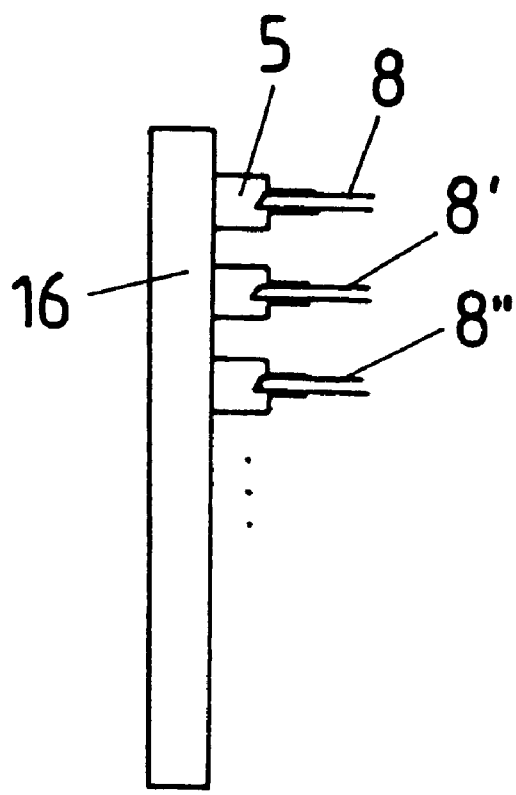
FIG. 5 is a sectional view of a module according to the invention with a plurality of laser diodes and TO housings.

FIG. 5 shows an exemplary embodiment of the module according to the invention in the case of which a multiplicity of laser diodes are disposed in TO housings 5, and coupled optical fibers 8, 8', 8" with fiber Bragg gratings in accordance with FIGS. 1 to 3 are disposed in an array on a carrier plate 16. In this configuration, the spatial grating period of the fiber Bragg grating differs for each optical fiber 8, 8', 8", and so the respective laser in each case has a somewhat different emission wavelength, and consequently light of a different wavelength is respectively launched into the individual optical fibers 8, 8', 8". The result is that through the use of similar laser diodes a module with a multiplicity of optical channels is provided such as is used, in particular, in DWDM systems. The individual optical channels in this case preferably have a fixed channel spacing of, for example, 100 GHz.

We claim:

1. A modulated optoelectronic laser module for transferring a signal, comprising:
a laser diode having an active region, a rear facet coated with a highly reflective layer forming a highly reflective surface and a front facet coated with an antireflection layer;
a single-mode glass fiber having an end face and a Bragg interference grating, disposed directly downstream of said end face, providing frequency-selective feedback, said highly reflective surface and said Bragg interference grating forming an optical resonator, said Bragg interference grating functioning as a fiber Bragg grating in said optical fiber, light being sent to said fiber Bragg grating or received from said fiber Bragg grating via said front facet of said laser diode;
a coupling lens system disposed between said laser diode and said glass fiber for coupling the light, said coupling lens system having a high-index coupling lens with a focal length of less than two millimeters; and
a standard TO housing accommodating said laser diode, said standard TO housing having a fiber plug connector for attaching said glass fiber to said housing, said fiber Bragg grating being formed in a region of said glass fiber within said fiber plug connector as an optical waveguide.

2. The module according to claim 1, wherein said high-index coupling lens is a lens selected from the group consisting of a silicon lens, a GaP lens, a SiC lens and an aspherical glass lens.

3. The module according to claim 1, wherein one of said front facet and said rear facet is aligned inclined to an optical axis of said laser diode.

4. The module according to claim 1, including a cylindrical ferrule to be plugged into said fiber plug connector of said housing, said glass fiber is embedded in said cylindrical ferrule.

5. The module according to claim 4, wherein said ferrule can be detachably connected to said housing.

6. The module according to claim 1, wherein said fiber plug connector can be detachably connected to said housing.

7. The module according to claim 1, wherein said fiber plug connector of said housing is a cylindrical fiber plug connector for receiving said glass fiber.

8. The module according to claim 1, wherein said end face of said single-mode glass fiber is chamfered.

9. The module according to claim 1, wherein said optical resonator has a length that is so short that a circulation frequency of light is above a desired modulation frequency of the module.

10. The module according to claim 9, wherein said length of said optical resonator is smaller than ten millimeters.

11. The module according to claim 1, wherein said laser diode is one of a plurality of optical resonators, and said fiber Bragg grating is one of a plurality of fiber Bragg gratings which are respectively constructed in a respective optical fiber, a spatial grating period of each of said fiber Bragg gratings differing with each optical fiber such that light of a different wavelength is respectively launched into individual optical fibers.

12. The module according to claim 1, wherein said coupling lens systems has a high-index coupling lens with a focal length of preferably less than one millimeter.

13. The module according to claim 1, wherein one of said front facet and said rear facet is aligned inclined to an optical axis of said diode at an angle of approximately 1° to 5°.

14. The module according to claim 1, wherein said module is used in dense wavelength division multiplex systems.

* * * * *

UNITED STATES PATENT AND TRADEMARK OFFICE
CERTIFICATE OF CORRECTION

PATENT NO.    : 6,647,038 B2
DATED         : November 11, 2003
INVENTOR(S)   : Hans-Ludwig Althaus et al.

It is certified that error appears in the above-identified patent and that said Letters Patent is hereby corrected as shown below:

<u>Title page,</u>
Item [63], should read as follows:
-- Continuation of application No. PCT/DE01/02262, filed on June 15, 2001. --

Signed and Sealed this

Sixteenth Day of March, 2004

JON W. DUDAS
*Acting Director of the United States Patent and Trademark Office*